United States Patent [19]
Ash

[11] Patent Number: 5,357,207
[45] Date of Patent: Oct. 18, 1994

[54] SEQUENTIAL AMPLIFIER

[75] Inventor: Darrell L. Ash, Sachse, Tex.

[73] Assignee: R.F. Monolithics, Inc., Dallas, Tex.

[21] Appl. No.: 81,802

[22] Filed: Jun. 23, 1993

Related U.S. Application Data

[63] Continuation-in-part of Ser. No. 8,522, Jan. 21, 1993.

[51] Int. Cl.⁵ .................................................. H03F 1/14
[52] U.S. Cl. ........................................ 330/51; 330/310
[58] Field of Search .................. 330/9, 51, 107, 310, 330/306, 149, 150; 455/290, 293, 341

[56] References Cited

U.S. PATENT DOCUMENTS

| | | | |
|---|---|---|---|
| 3,113,268 | 12/1963 | Horak | 330/150 |
| 3,921,085 | 11/1975 | Keane | 329/110 |
| 4,952,832 | 8/1990 | Imae | 310/313 R |
| 4,954,795 | 9/1990 | Choi | 310/313 R |
| 5,099,204 | 3/1992 | Wheatley, III | 330/310 |
| 5,175,871 | 12/1992 | Kunkel | 330/51 |

FOREIGN PATENT DOCUMENTS 0354587  2/1990  European Pat. Off. ............... 330/51

Primary Examiner—Steven Mottola
Assistant Examiner—Tiep H. Nguyen
Attorney, Agent, or Firm—Jones, Day, Reavis & Pogue

[57] ABSTRACT

A sequential amplifier having at least two amplifier stages separated by a delay device such that switching means may energize either or both amplifier stages at any given time to obtain maximum gain of the input signal so long as no oscillations occur between stages, thus allowing a signal to be amplified by adjacent amplifier stages without the adverse effects of feedback associated therewith.

10 Claims, 4 Drawing Sheets

SEQUENTIAL AMPLIFIER

This application is a continuation-in-part application of co-pending application Ser. No. 07/008,522 filed Jan. 21, 1993, and having the same title and inventor as the present application.

BACKGROUND OF THE INVENTION

1. Field of the Invention

This invention relates to amplifiers in general and more particularly to amplifiers for use with weak signals for radio frequency (RF) and audio frequency applications. The invention is ideally suited for use in radio and television receivers. However, it will be appreciated that the invention can be used in any electronic device where weak signals are to be amplified and signal gain is to be increased.

2. Description of the Prior Art

Radio receivers have been in existence for almost a century. The earliest receivers were extremely crude in design and consisted of no more than a crystal receiver with a simple diode connected to a pair of headphones. The diode and headphone combination acted as a detector/low pass filter wherein an RF signal generated by the crystal was detected by the diode and the low frequency aspect was passed by the headphones while the higher frequency carrier was blocked. These circuits included a so-called "cat's whisker" wherein a wire comprising the cat's whisker would be placed against various spots in the crystal detector. The process of moving the cat's whisker from one location to another was a crude form of station tuning whereby the frequency at which the crystal was oscillating was essentially shifted slightly thereby causing the crystal to act as a detector/demodulator for that given frequency. Thus, the signal was effectively demodulated and the audio portion could be heard in the headphones.

This crystal detector type of radio suffered from many disadvantages. Among those were a lack of sensitivity, poor station selection and low power. The low output power was witnessed by the fact that only a few stations could be detected by the radio.

To overcome these disadvantages, tuned radio frequency (TRF) receivers were developed. TRF receivers gave improved selectivity, sensitivity and output power by adding radio frequency and audio frequency amplifier stages. The purpose of TRF receivers was essentially to enhance signal gain and the result was that more stations could be detected and heard over speakers as well as with headphones.

A significant problem with this type of receiver was distortion. This distortion resulted from the occurrence of positive feedback between amplifier stages. The distortion problem was particularly acute at higher frequencies. Higher frequencies were more difficult for the receiver to process due to the fact that the various leads comprising the receiver signal processing stages would act as "mini antennae" radiating the signal into all parts of the receiver and thereby introducing feedback and unwanted distortion into the circuit.

In addition, physical coupling (conduction) of the RF signals from one stage to another occurs. For example, the common power supply bus requires filtering devices between stages to attempt to reduce the coupling of the RF signals from one stage to another through the power supply distribution bus line. Therefore, as used herein, the term "radiating", or its equivalent, is intended to include "conduction" of the signal by a physical coupling such as a common power supply bus.

The next major advancement was the superheterodyne receiver. The superheterodyne has many important advantages over the above receiver types. The main distinction between the superheterodyne and the earlier versions of radio receivers is that the superheterodyne will amplify an RF signal in at least two different stages before it reaches the audio amplifier. The method with which this occurs represents a major improvement over previous designs. In a superheterodyne there are a minimum of two amplifier stages. A first stage includes an RF amplifier for providing gain to the weak radio frequency signals received from the antenna. A mixer stage, or single conversion stage, mixes the amplified RF signal with an oscillator signal. These two signals are designed to differ by a specified frequency. The resultant output of the first detector stage is called the intermediate frequency ("IF") and represents the difference between the oscillator frequency and the RF frequency. This intermediate frequency is then fed through an IF amplifier and a detector wherein the high frequency component is eliminated and the remaining audio signal is then fed to an audio amplifier. The purpose for using an IF stage is to reduce the RF frequency in the first stage to a second frequency different from the RF frequency so that radiation from the RF circuit would not adversely influence or be coupled to the IF stage during amplification in the IF stage. In addition, amplification in the IF stage would not affect the RF stage. Thus the superheterodyne receiver allowed more amplification and gain in the receiver since the two stages, operating at different frequencies, did not adversely influence each other.

The problem of feedback and oscillation continues to exist when amplifier stages operating at the same frequency are in the vicinity of each other. This is, again, due to signal radiation from one amplifier stage to another. This places a severe limitation on the abilities of amplifiers to increase the output power of a signal. The problem is even more pronounced at higher frequencies where individual portions of the circuit, such as connection terminals, will act as antennae thus feeding the output signals back into the input portions.

SUMMARY OF THE INVENTION

The present invention circuit overcomes the above-stated disadvantages of the prior art. In the broadest application, the invention consists of a minimum of two amplifier stages separated by a signal delay device. In addition, each amplifier stage is controlled by a switching unit. Essentially, a signal will be received by the first amplifier stage and the amplifier is energized by the switching unit. In one embodiment, the second amplifier stage is de-energized such that the second amplifier will not be operating during the time the first amplifier is in operation. It must be noted, however, that other embodiments are both possible and claimed. The preferred embodiment as claimed in this application allows more then one amplifier stage to be energized at any given time so long as no feedback occurs to cause interference between or among amplifier stages. One mode of implementing this embodiment is to incorporate a switching means which energizes each of at least two amplifier stages at any given time such that both amplifier stages may remain energized until just prior to oscillation occurring between stages. The first amplifier is then de-energized while the second amplifier is energized. It should also be recognized that this embodiment could apply equally to systems with multiple amplifier stages.

Thus, there will be no determined signal feedback either by radiation or conduction, coupled between the first and second amplifier stages. The signal from the first RF amplifier will pass through the delay device and into the second stage amplifier. Prior to, at the time of, or after the signal emerges from the delay line, the second amplifier will be energized and the first amplifier will be de-energized. In the second stage amplifier, the signal will again be amplified. The first stage amplifier will be switched OFF at a time prior to oscillation occurring. This time could be before, at, or after the time the second stage amplifier is switched ON and vice versa. The function of the delay device is to ensure that when the amplifier stage receiving the signal is energized and the other stage is de-energized or that oscillation between stages does not immediately occur when both stages are energized but is delayed.

The delay circuit will slow the signal's travel between stages 1 and 2. The amount of delay may be selected for a particular frequency or operation. The limiting factor always is that amplifier stage 1 and amplifier stage 2 must not be energized simultaneously sufficiently long to cause oscillation between the stages.

It is, therefore, the principal object of this invention to provide increased amplification and stable gain of a circuit for all audio and radio frequencies.

It is another object of the invention to provide improved amplification and stable gain for electronic circuits at a given frequency without the frequency radiation or conduction from any one stage adversely affecting another stage.

It is still a further object of the invention to provide an amplifier of high frequency radio signals wherein one or more stages of stable amplification at the same signal frequency can be used without one stage radiating or conducting the amplified signal to another stage to cause instability, oscillation and distortion.

It is yet another object of the present invention to provide an amplifier of a given signal frequency in at least two stages wherein when one stage is energized, the at least one other stage is de-energized to prevent instability such that frequency radiation from the one stage is not coupled to the at least one other stage and oscillation is avoided.

It is also an important object of the present invention to allow two consecutive amplifier stages to be energized with an overlap between the energization of the two stages. The limiting factor is that the first stage may remain energized while the second stage is energized only for as long as oscillation does not occur due to feedback effects between stages.

BRIEF DESCRIPTION OF THE DRAWINGS

These and other objects of the present invention will be more fully understood in conjunction with the accompanying drawings in which like numbers indicate like components and in which.

DETAILED DESCRIPTION OF THE INVENTION

Figure 1:
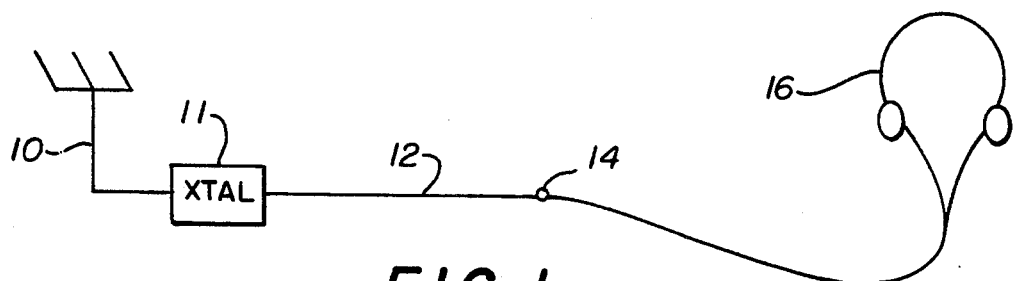
FIG. 1 is a diagram of a prior art basic diode detector radio receiver.

FIG. 1 is a generalized diagram of the basic prior art crystal detector radio receiver. The circuit includes some type of an antenna 10 feeding an RF signal into a crystal 11 that served as the bandpass filter, could select a station and generate an audio signal on a "cat whisker" 12 to a terminal 14. A pair of headphones 16 coupled to the terminal 14 would detect the audio signal by decoupling the radio frequency signals and allowing the audio modulation envelope to be heard. These sets were known as crystal sets.

Figure 2:
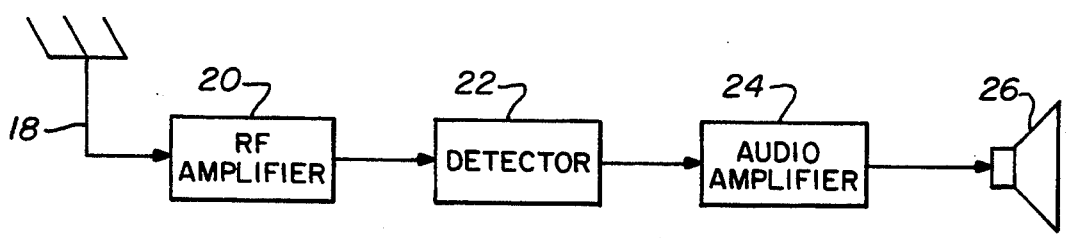
FIG. 2 is a block diagram of a prior art tuned radio frequency (TRF) receiver.

As the systems improved, the circuit of FIG. 2 came into being. An RF amplifier 20 was placed after the antenna 18 and before a detector 22. The output of the detector 22 was coupled to an audio amplifier 24 where gain was added to the signal and the signal then drove an audio output device such as headphones or a speaker 26. Of course the signals were weak and, even with the RF amplifier and the audio amplifier, there was still a great difficulty in amplifying the weak signals sufficiently that they could be heard. When more RF amplifier stages 20 were added in the RF section, the RF frequencies caused each part of the RF amplifier to become a small signal radiator or antenna that radiated the RF frequency to all other parts of the RF amplifier section. If two or more RF amplifier stages were added in the RF section, the output of the second amplifier was simply radiated back to the first amplifier as the gain increased and eventually the stages simply oscillated. Thus, there is a limit to the amount of amplification that could be obtained in the RF section. At first cables were shielded and circuits were enclosed in metal boxes to prevent the radiation from adversely influencing other parts of the RF circuit. As the frequencies increased and the circuit size decreased, radiation from one stage to the other became even more pronounced.

Figure 3:
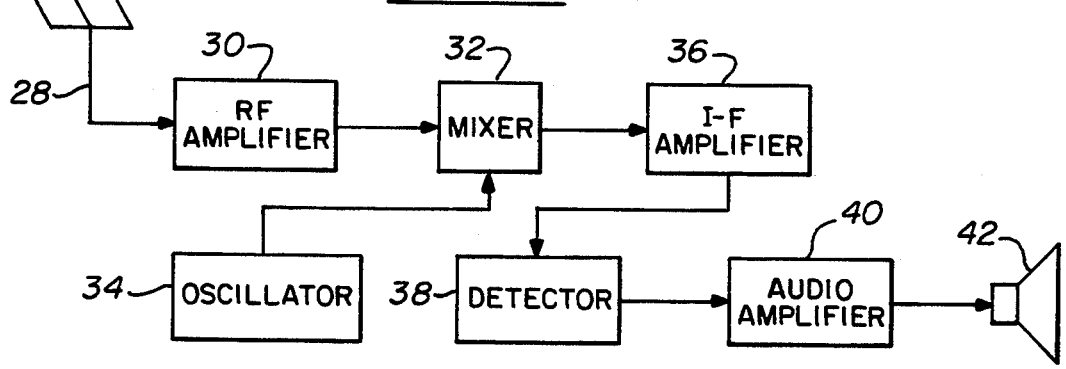
FIG. 3 is a block diagram of a prior art superheterodyne receiver.

Thus, the superheterodyne receiver similar to that shown in FIG. 3 was introduced. The signal from the antenna 28 is coupled through a first RF amplifier where the signal is amplified and gain added to it. It is then coupled to a mixer 32 which is driven by an oscillator 34. The difference frequency signal between the oscillator frequency and the RF amplifier frequency was an intermediate frequency (IF) and was coupled into an IF amplifier 36 for the amplification. The RF stage 30 and the IF stage 36 did not adversely influence each other because they were operated at totally different frequencies. This output signal from the IF amplifier 36 was then coupled to detector 38, audio amplifier 40 and the audio output device 42 such as a speaker or earphones. This circuit was known as a single conversion superheterodyne receiver. If more gain was to be added, second and even third conversion stages with mixers were added to further reduce the signal to different lower frequencies such that each stage was operating at a different frequency and one stage would not adversely influence another stage. In addition, common circuit connections, such as power supply lines coupled the RF signals from one stage to another (conduction) and therefore filtering devices were inserted in the lines connecting stages to each other to reduce the amount of such conductive coupling between stages.

Figure 4:
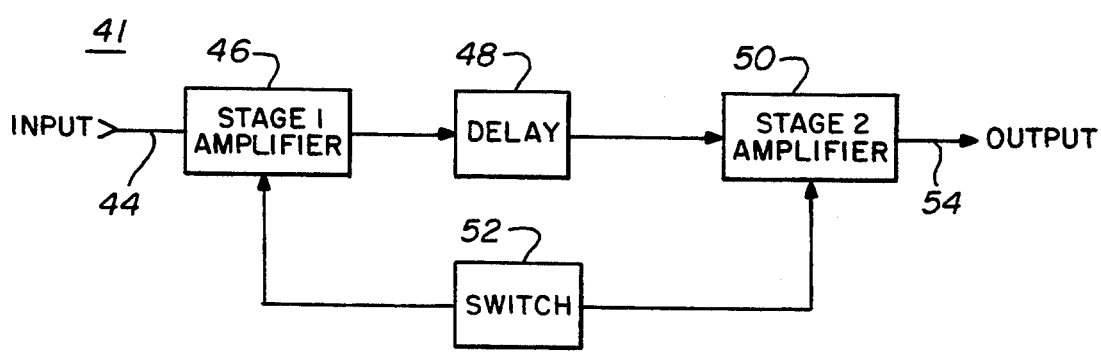
FIG. 4 is a general block diagram of the present invention.
Figure 5:
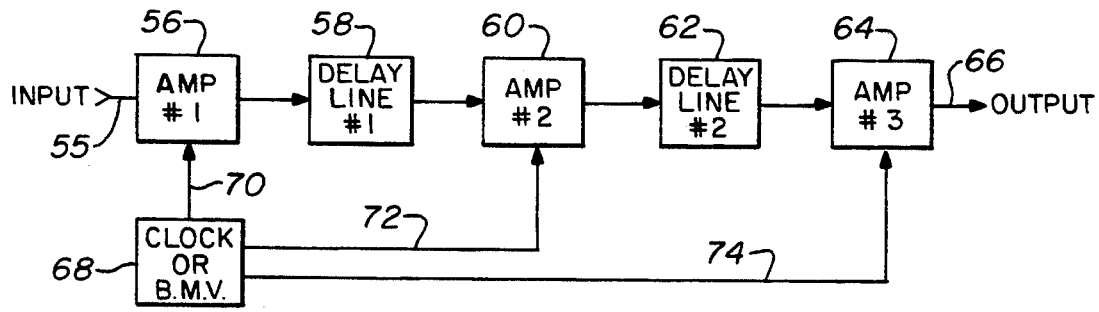
FIG. 5 is a diagram of m amplifier stages coupled by m—1 delay lines and driven by a clock.

Referring to the drawings and more particularly to FIGS. 4 and 5 there may be seen the block diagram of the sequential amplifier of the present invention. The sequential amplifier 41 consists of at least two stages, 46 and 50. A delay device 48 is placed between the amplifier stages 46 and 50 and a switch 52 is used to control adjacent amplifier stages in the proper sequence. A delay line may be constructed from a variety of well-known devices such as a surface acoustic wave device.

Each amplifier stage may be similar in design and construction. However, this is not essential. The requirement for each amplifier stage is that it not generate an output that causes oscillations with adjacent stages. Thus, the most simple and straightforward manner of achieving this result occurs when each stage amplifies or provides gain to an input signal when it is energized and the other stage or stages operating at the same frequency are de-energized.

The switching unit depicted in FIG. 4 will control adjacent amplifier stages so that, in the preferred embodiment, no two amplifier stages are energized simultaneously. A switch may be constructed from among a variety of well-known devices including clocks or bistable multivibrators.

As can be seen in FIG. 4, an input signal on terminal 44 is coupled to an amplifier 46 which may be considered to be the first stage amplifier. The output signal from the amplifier 46 is coupled to a delay line 48. The output of the delay line 48 is coupled to a second amplifier 50 which may be considered to be the second stage amplifier. The output of the second stage amplifier is coupled to an output terminal 54. In this embodiment, the switch 52 operates such that the first stage amplifier 46 is turned ON and the second stage amplifier 50 is turned OFF for a predetermined period of time. Assume, for example only, that the delay 48 has the delay time of one microsecond. The switch 52 may then turn ON the stage 1 amplifier 46 for a predetermined period of time, such as, for example only, one microsecond. Switch 52 then turns OFF the stage 1 amplifier 46 and, as the amplified signal is emerging from the one microsecond delay line 48, switch 52 turns ON the second stage amplifier 50 which again provides an amplification to the RF signal. Thus, for this embodiment, at no time are the first and second stage amplifiers ON simultaneously.

Figure 8:
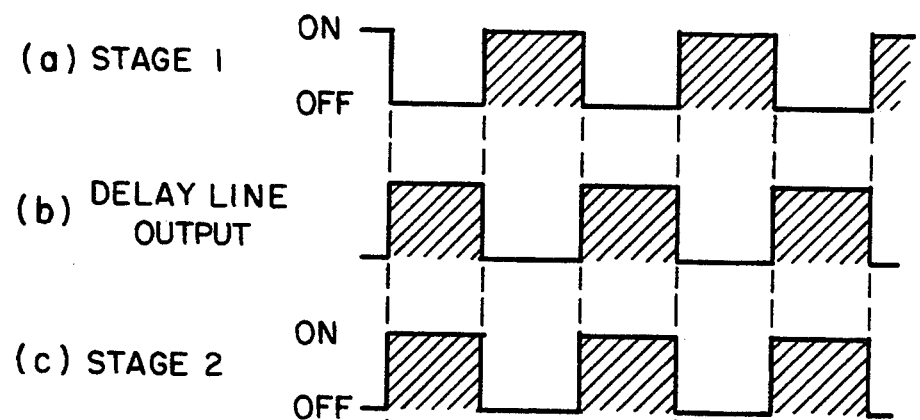
FIG. 8 is a timing chart illustrating the energization timer of the first and second stage amplifiers with respect to the delay time of the delay line.

The amount of delay provided by the delay line 48 and the time at which switch 52 turns the first and second stage amplifiers 46 and 50, respectively, ON and OFF may be varied. This timing relationship is illustrated with reference to FIGS. 8 and 9. In FIG. 8(a), the width of the waveform (shown with shading for clarity) indicates the time that the stage 1 amplifier is ON or energized. In waveform (b), the shaded area represents the delay time of the delay line. In waveform (c), the shaded area represents the time of energization of the stage 2 amplifier. Thus it is noted in FIG. 8 that the stage 1 amplifier 46 may be ON for some given period of time, such as one microsecond for example only. The delay line may also have a given delay time, such as one microsecond, as illustrated. Thus, when the amplifier 46 in stage 1 is energized or ON, the output signal is coupled to the delay line and emerges from the delay line after the one-microsecond delay and at that time the stage 1 amplifier is de-energized or turned OFF and the stage 2 amplifier is energized or turned ON to receive the output signal from the delay line 48.

Figure 9:
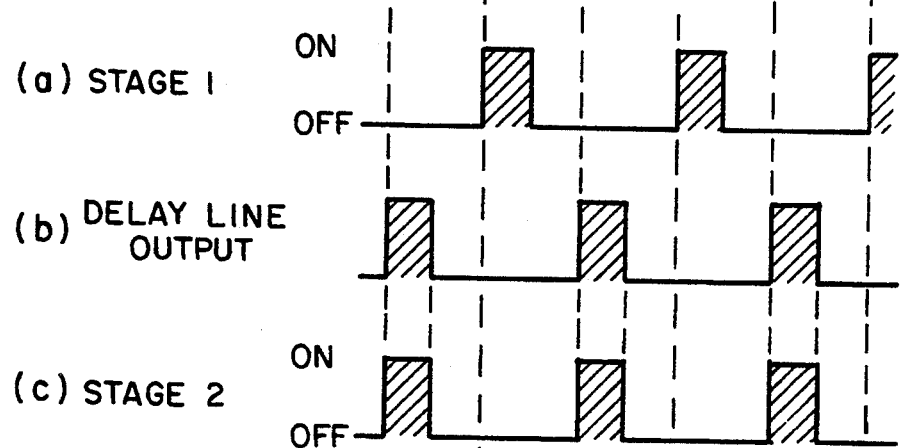
FIG. 9 is a timing chart similar to that shown in FIG. 8 illustrating the timing relationship of the first and second amplifier stages with respect to the delay time of the delay line when the energization time of the amplifiers is less than the delay time of the delay line.
Figure 10:
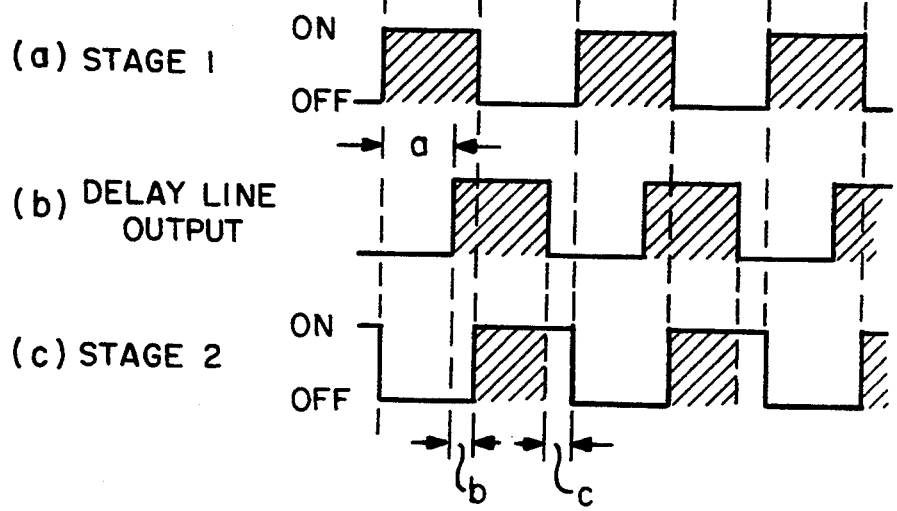
FIG. 10 is a timing chart similar to that shown in FIG. 8 and FIG. 9 illustrating how the timing can be arranged to avoid precision gating of the amplifier stages to their ON and OFF states.

As can be seen in FIG. 9, the time period of energization of the stage 1 amplifier as illustrated in waveform (a) may be some fraction of the delay line time period, such as one-half microsecond while the delay line may have a larger delay time period such as one microsecond as shown in waveform (b). However, when the amplified signal from the first amplifier stage 46 passes through the delay line 48 and emerges therefrom, the second stage amplifier 50 is turned ON and amplifies the output signal. It is noted in FIG. 9 that the stage 1 amplifier 46 is de-energized long before the signal emerges from the delay line. Clearly, the times given are for illustration purposes only. For instance, the width of the illustrated waveforms in (a), (b) and (c) of FIG. 8 could be two microseconds, five microseconds or any other time as desired. In like manner, the waveforths illustrated in FIG. 9(a), (b) and (c) could be one-quarter microsecond and one-half microsecond, respectively, for waveforms (a) and (b). They could be one microsecond and two microseconds for waveforms (a) and (b). In other words, the time delay can be selected to meet the needs of a particular situation. For example, the stage 1 amplifier ON time may be greater than the delay time as shown in FIG. 10 where the stage 1 amplifier ON time is X and the delay line delay time is ¾X, for purposes of explanation and example only. The signal from the stage 1 amplifier as shown in FIG. 10(a) exits the delay line ¾X later, the time period shown in FIG. 10(b) by the letter "a", and ¼X before stage 2 turns ON as shown in FIG. 10(c) by the letter "b". When all of the stored signal has exited the delay line (FIG. 10(c)), the second stage amplifier is still ON as shown by the letter "c" but no signal is present. The timing then repeats itself. The first amplifier stage amplifies the signal for a full period, X, while the second amplifier stage amplifies the signal for a period of ¾X. That portion of the signal exiting the delay line before amplifier 2 is turned ON is lost. The essential requirement in this embodiment is that both of the first and second stage amplifiers 46 and 50 cannot be ON or energized simultaneously. With the circuit 41 operating in this manner, the first amplifier stage 46 can amplify the RF signal to its maximum capability. Although the signal may be radiating and/or being conducted to the second stage amplifier 50, that amplifier is OFF and consequently there are no adverse effects. In like manner, when the second stage amplifier 50 is amplifying the signal to its maximum capability, it is also radiating the RF signal. However, because the first stage amplifier 46 is then turned OFF, there is no adverse effect. Thus maximum gain can be obtained in the RF stages where the gain is most difficult to obtain. It is to be understood, of course, that the circuit 41 shown in FIG. 4 can be used with any desired frequencies from audio to UHF. Even in audio stages, if the amplifier stages are driven sufficiently hard, radiation and/or conduction can occur from one stage to another at audio frequencies. Thus, the circuit can be used with any frequency so long as the amplifier stages are not energized simultaneously.

FIG. 5 is a general representation of a circuit utilizing the present invention and having three stages of gain. As can be seen in FIG. 5, an input signal on line terminal 55 is coupled to an amplifier 56, the first stage amplifier. Its output is coupled to the first delay line 58 and the output of the delay line 58 is coupled to a second amplifier stage 60. The output of the second amplifier stage 60 is coupled to a second delay line 62 that has its output coupled to the third amplifier stage 64. The output terminal 66 is coupled to and receives the output from the third amplifier 64. A clock or a bistable multivibrator 68 may be used to generate timing signals on lines 70, 72 and 74 at any desired interval in a well-known manner. When the clock 68 generates a first signal on line 70, only the first amplifier stage 56 is energized. It amplifies the input signal and couples it to the delay line 58. In one embodiment, when the first stage amplifier 56 is shut OFF by the clock pulse line on line 70, the clock generates a second pulse on line 72 which turns the second amplifier stage 60 ON when the signal exits from the delay time of delay line 58. Of course, the gating may be such that second amplifier stage 60 is turned ON before, or after, the signal exits from delay line 58 as explained previously. The second amplifier stage 60 then receives the delayed amplified signal from the delay line 58 and amplifies it. In this embodiment, clock 68 then removes the signal from line 72 and de-energizes amplifier 60. Clock 68 then provides the clock signal on line 74 that energizes amplifier 64, the third stage amplifier. It receives the amplified output from delay line 62 and generates the output on line 66. Thus three stages of amplification are provided in FIG. 5. Again, it will be noted that only one of the amplifiers 56, 60 and 64 is energized at any one time. Thus while each of the amplifiers 56, 60 and 64 is radiating signals when it is energized, the radiations are not a detrimental influence on the remainder of the system because any two of the amplifiers are de-energized during the time the third amplifier is energized and thus the de-energized amplifiers do not accept the radiated signals.

Figure 6:
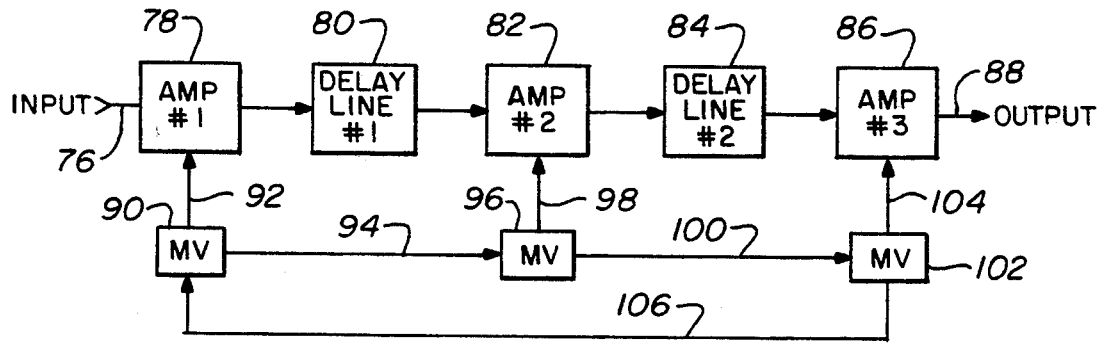
FIG. 6 is a diagram of m amplifier stages coupled by m—1 delay lines and driven by m monostable multivibrators.

FIG. 6 is a circuit similar to that in FIG. 5 except that a monostable multivibrator 90 is used to energize the first amplifier 78 for a predetermined period of time with an enabling pulse on line 92. When the enabling pulse on line 92 decays, the amplifier 78 is de-energized and the trailing edge of the pulse on line 94 then energizes multivibrator 96. Again, an enabling pulse is produced on line 98 to energize the second stage amplifier 82 for a predetermined period of time. When the pulse on line 98 is removed, the trailing edge of the pulse causes a signal on line 100 that energizes the third multivibrator 102. Again, an enabling pulse is generated on line 104 that energizes amplifier 86, the third stage amplifier. At the time when the third stage amplifier 86 is de-energized, the trailing edge of the pulse from multivibrator 102 on line 106 energizes the first multivibrator 90 and the cycle repeats itself. Clearly there may be other arrangements that could be used, but in any case with this embodiment the limiting factor is that only one of the three amplifiers in FIGS. 5 and 6 may be energized at any one moment in time.

Figure 7:
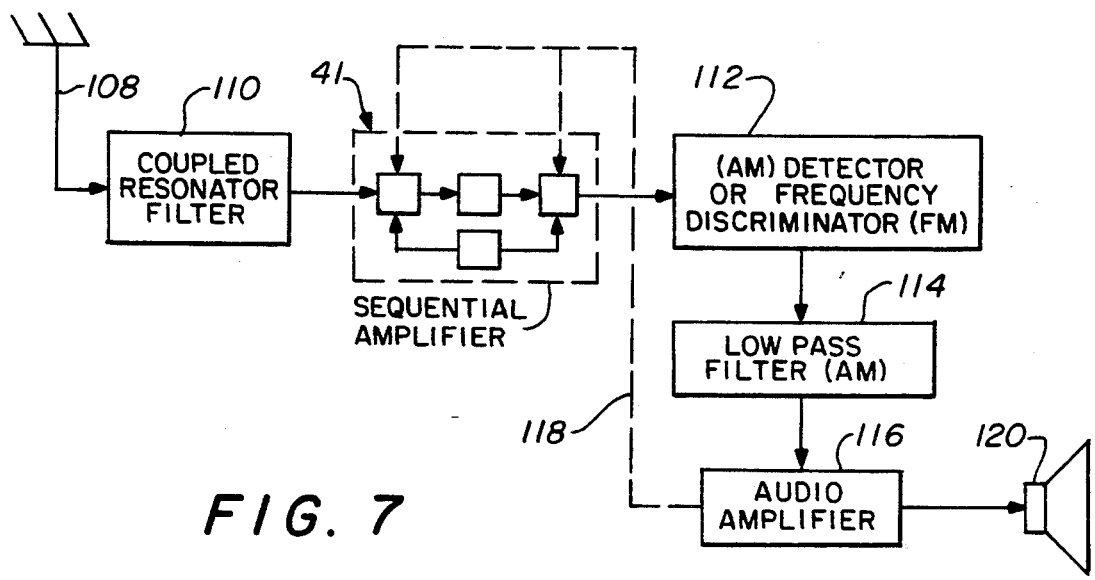
FIG. 7 is a block diagram of the present invention in a typical radio receiver application.

A typical application of the sequential amplifier is shown in FIG. 7. Here the sequential amplifier 41 is included in a receiver such as a radio receiver or a TV receiver. The antenna 108 receives a modulated radio frequency signal that is coupled to and filtered by a tunable or nontunable filter such as a coupled resonator filter 110 to select and isolate the modulated RF signal. The sequential amplifier 41 is shown in phantom lines, and is a duplicate of the circuit of FIG. 4. It will amplify the selected input RF signal as previously described. The amplified RF signal will then pass through the detector 112 that, in combination with device 114, will detect and demodulate the signal. The device 112 may be a frequency discriminator for FM signals or an AM detector for AM signals. The low pass filter 114 removes the enabling or switching pulses as well as the RF carrier as is well known by those skilled in the art. The detected signal will essentially be the audio component of the received radio signal. The detected signal will then pass through an audio amplifier 116 and then into the audio output device 120. The output power of the sequential amplifier may be adjusted by means of an automatic gain control (AGC) 118 for AM circuits as desired.

Figure 11:
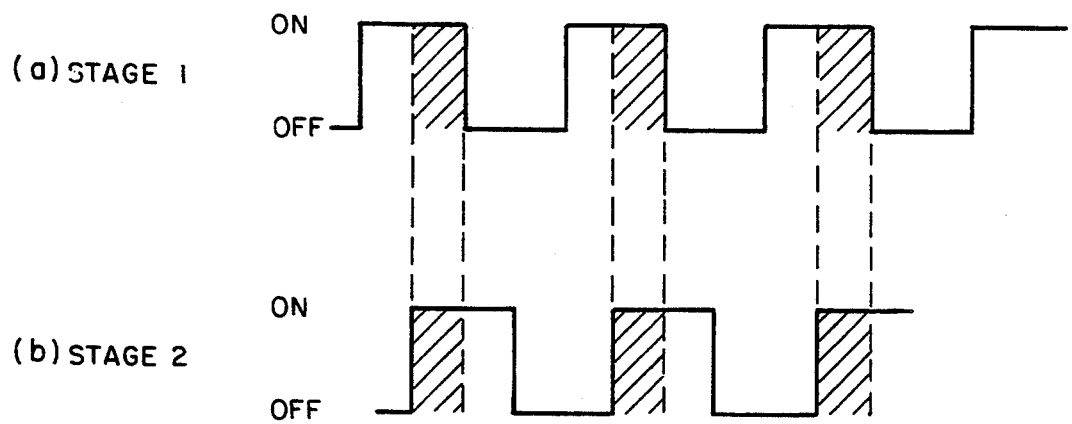
FIG. 11 is a timing chart illustrating the overlap in the energized states of the first and second stages for an alternate embodiment of the invention.
Figure 12:
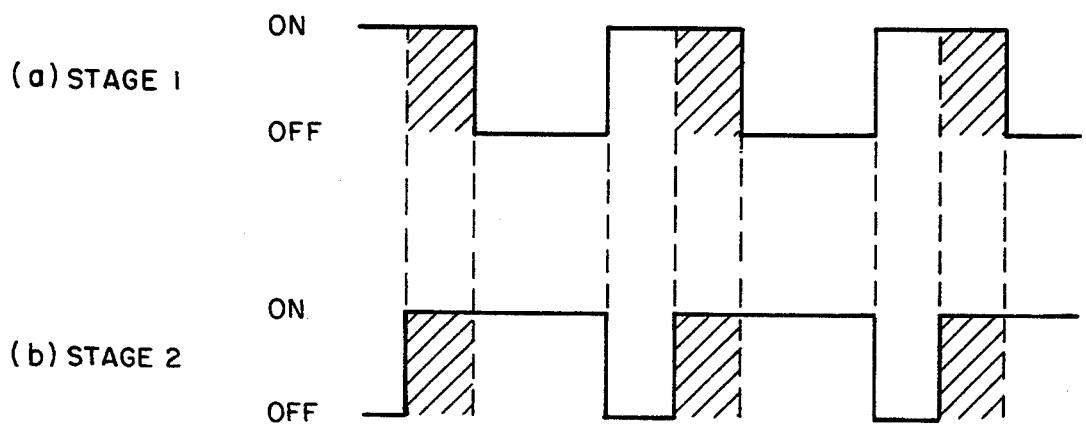
FIG. 12 is a timing diagram similar to that of FIG. 11 with the exception that the period of energization is different for each stage.

FIGS. 11 and 12 illustrate two possible alternate timing relationships between stages as the preferred embodiment of this application, wherein both the first and second stages may be energized at a given time to achieve maximum gain for so long as no feedback occurs to cause interference between amplifier stages. The block diagram for such a circuit is similar to that shown in FIG. 4. This embodiment is feasible because of the delay introduced by the delay device 48. This delay provides a period of time before feedback effects between simultaneously energized adjacent stages will produce unwanted oscillation. The typical configuration for such an embodiment would therefore require that the first stage be de-energized just prior to the point where circuit oscillation occurs.

Thus, in FIG. 11 there is depicted, for example only, a situation where both first and second stages are energized for an equal duration, with an overlap between the energization of in both stages shown areas with hatched lines. In FIG. 12, there is depicted a situation where is the first stage energized for a shorter period than the second stage, again with an overlap wherein both stages are simultaneously energized as shown by the areas with hatched lines. In either case the limiting factor is that the first stage may remain energized while the second stage is also energized only for so long as oscillation does not occur due to feedback effects between stages. Naturally, this point where oscillation occurs will vary depending on many factors, including the particular circuit components and frequencies chosen. It must also be noted that this embodiment is also useful in multiple amplifier stage systems.

One skilled in the art will recognize that the alternate energization of the amplifiers is a form of sampling of the input signal. It will be understood that the sampling rate can be greater than or less than the modulation signal frequency. Thus with a high sampling rate there would be a large number of samples per cycle of the modulation signal. With a low sampling rate, there would be a large number of modulation cycles per sample.

Thus, there has been disclosed a novel sequential amplifier that can be used to amplify electronic signals of any type where radiation or coupling of the signals from one stage by other means could cause feedback to a previous stage and thus limit the amount of stable amplification that can be achieved.

As can be seen from the above description, the sequential amplifier is ideally suited for use in radio receivers. Note, however, that this type of circuit has many applications. It could be used to amplify signals in a transmitter, for instance. This circuit may be employed almost anywhere electronic signal amplification is needed.

The circuit can be used with signals such as AM, FM, PPM, PCM, FSK, digital signals, analog signals and other like signals that need to be amplified.

While the invention has been described in connection with a preferred embodiment, it is not intended to limit the scope of the invention to the particular form set forth, but, on the contrary, it is intended to cover such alternatives, modifications, and equivalents as may be included within the spirit and scope of the invention as defined by the appended claims.

I claim:

1. A sequential amplifier comprising:
   m successive amplifier stages, each amplifier stage having time periods for amplifying an input signal and where $m \geq 3$;
   m—1 delay lines, each delay line coupling two successive amplifier stages respectively of the m amplifier stages for causing a predetermined time delay before an amplified input signal from one of the m amplifier stages is coupled to a succeeding one of the m amplifier stages; and
   switching means for energizing only each two successive ones of the m amplifier stages such that their amplifying time periods overlap for a portion of time only so long as no feedback occurs that causes oscillation between said two successive ones of the amplifier stages to obtain maximum gain of the input signal.

2. A sequential amplifier as in claim 1 wherein said switching means energizes each of said at least two successive ones of the amplifier stages for said portion of time such that a preceding one of said two successive amplifier stages is de-energized before oscillation between the at least two successive amplifier stages begins.

3. A sequential amplifier as in claim 1 wherein the switching means comprises a multivibrator.

4. A sequential amplifier as in claim 1 wherein the switching means comprises:
   a clock for generating m output signals, a first output signal of the m output signals for energizing a first one of the m amplifier stages;
   a second output signal of the m output signals for energizing a second successive one of the m amplifier stages; and
   an mth output of the m output signals signal for energizing an mth one of the m amplifier stages to obtain maximum gain of the output signal so long as no feedback occurs to cause oscillation between the amplifier stages.

5. A sequential amplifier as in claim 1 wherein the switching circuit comprises m monostable multivibrators, each of the m multivibrators having an output pulse coupled to both a corresponding one of the m amplifier stages for energizing the amplifier stage and to a successive one of the monostable multivibrators for activating the successive monostable multivibrator.

6. A method of amplifying an electronic signal comprising the steps of:
   coupling the electronic signal to a first one of m successive amplifier stages, each amplifier stage having time periods for amplification of the electronic signal and where $m \geq 3$;
   coupling each two successive ones of the m amplifier stages with one of m—1 delay lines to cause a predetermined time delay before an amplified electronic signal from one amplifier stage is coupled to a succeeding amplifier stage;
   sequentially energizing each two successive ones of the m amplifier stages such that their amplifying time periods overlap for a portion of time only so long as no oscillations occur between said two successive ones of the amplifier stages to obtain maximum gain of the signal; and
   de-energizing a first of each said two successive ones of the amplifier stages before oscillation occurs between said two successive amplifier stages.

7. An RF signal receiver comprising:
   signal receiving means for receiving modulated RF frequency input signals;
   a frequency tunable device coupled to the signal receiving means for selecting a predetermined frequency signal from the modulated RF frequency input signals;
   a sequential amplifier circuit coupled to the tunable device for amplifying the selected RF frequency signal, the sequential amplifier circuit comprising:
   at least two amplifier stages that become unstable when directly coupled to each other, each amplifier stage having time periods for amplifying the selected RF frequency signal and generating an output signal;
   a delay device coupling a preceding one of the at least two amplifier stages to a succeeding one of the at least two amplifier stages for causing a predetermined time delay before an amplified input signal from the preceding amplifier stage is coupled to the succeeding one of the amplifier stages for amplification;
   switching means for preventing instability of the at least two amplifier stages from occurring by energizing both of said at least two amplifier stages such that their amplifying time periods overlap for a period of time to obtain maximum gain of the RF frequency signal only so long as no feedback occurs to cause interference between the at least two amplifier stages;
   said switching means de-energizing a first of said at least two amplifier stages before oscillation occurs between said at least two amplifier stages;
   a detector coupled to the sequential amplifier circuit for demodulating the output signal;
   a filter coupled to the detector for removing unwanted signals; and
   an output amplifier for amplifying the demodulated output signal.

8. A receiver as in claim 7 wherein the demodulated output signal is an analog data signal.

9. A receiver as in claim 7 wherein the demodulated output signal is a digital data signal.

10. A receiver as in claim 8 wherein the analog data signal is an audio signal.

* * * * *

UNITED STATES PATENT AND TRADEMARK OFFICE
CERTIFICATE OF CORRECTION

PATENT NO. : 5,357,207
DATED : October 18, 1994
INVENTOR(S) : Darrell L. Ash

It is certified that error appears in the above-identified patent and that said Letters Patent is hereby corrected as shown below:

Column 3, line 4, after "feedback", insert -- , --.

Column 8, line 48, after "of" and before "both, delete "in" and after "shown" and before "areas", insert -- in --.

Column 8, line 50, after "where" and before "the", delete "is" and after "stage"and before "energized", insert -- is --.

Column 9, line 60, cancel "of the m output signals signal" and insert in place thereof -- signal of the m output signals --.

Signed and Sealed this

Twenty-eight Day of February, 1995

Attest:

BRUCE LEHMAN

Attesting Officer    Commissioner of Patents and Trademarks